United States Patent
Enda et al.

(10) Patent No.: US 9,396,959 B2
(45) Date of Patent: Jul. 19, 2016

(54) SEMICONDUCTOR DEVICE WITH STOP LAYERS AND FABRICATION METHOD USING CERIA SLURRY

(75) Inventors: Takayuki Enda, Fukuchima-ken (JP); Masayuki Moriya, Fukuchima-ken (JP)

(73) Assignee: Cypress Semiconductor Corporation, San Jose, CA (US)

( * ) Notice: Subject to any disclaimer, the term of this patent is extended or adjusted under 35 U.S.C. 154(b) by 125 days.

(21) Appl. No.: 13/523,568

(22) Filed: Jun. 14, 2012

(65) Prior Publication Data

US 2012/0248597 A1    Oct. 4, 2012

Related U.S. Application Data

(60) Division of application No. 11/480,207, filed on Jun. 29, 2006, now Pat. No. 8,222,147, which is a continuation-in-part of application No. PCT/JP2005/011965, filed on Jun. 29, 2005.

(51) Int. Cl.
  *H01L 21/3105* (2006.01)
  *H01L 21/308* (2006.01)
  (Continued)

(52) U.S. Cl.
  CPC ...... *H01L 21/31053* (2013.01); *H01L 21/3081* (2013.01); *H01L 21/31111* (2013.01); *H01L 21/32139* (2013.01); *H01L 21/76224* (2013.01)

(58) Field of Classification Search
  CPC ............. H01L 21/31053; H01L 21/3081; H01L 21/31111; H01L 21/32139
  USPC ........................................ 463/697
  See application file for complete search history.

(56) References Cited

U.S. PATENT DOCUMENTS 5,677,239 A * 10/1997 Isobe ..................... 438/633
5,856,225 A *  1/1999 Lee .................. H01L 29/6659
                                              257/E21.199

(Continued)

FOREIGN PATENT DOCUMENTS

EP        0961315 A1    12/1999
EP         961315 A1 *  12/1999

(Continued)

OTHER PUBLICATIONS

U.S. Appl. No. 11/480,207: "Semiconductor Device With Stop Layers and Fabrication Method Using Ceria Slurry," Takayuki Enda, filed Jun. 29, 2006; 44 pages.

(Continued)

*Primary Examiner* — John P Dulka

(57) ABSTRACT

The present invention provides a method of fabricating a semiconductor device including forming stop layers (32) that include silicon oxy-nitride films above a semiconductor substrate, forming a cover film (34) between and on the stop layers, in which a top surface of the cover film above a region between the stop layers is higher than top surfaces of the stop layers, and polishing the cover film to the stop layers by using ceria slurry, and also provides a semiconductor device including metal layers (30) provided above a semiconductor substrate, silicon oxy-nitride films (32) provided on the metal layers, and an embedded layer (36) provided between the metal layers to have a top surface substantially coplanar with top surfaces of the silicon oxy-nitride films. According to the present invention, it is possible to provide a semiconductor device having a film of excellent planarization on a surface thereof and fabrication method therefor.

14 Claims, 13 Drawing Sheets

(51) Int. Cl.
*H01L 21/311* (2006.01)
*H01L 21/3213* (2006.01)
*H01L 21/762* (2006.01)

(56) References Cited

U.S. PATENT DOCUMENTS

| | | | |
|---|---|---|---|
| 5,858,780 A | 1/1999 | Yokoyama | |
| 5,858,870 A | 1/1999 | Zheng et al. | |
| 6,054,383 A | 4/2000 | Suzuki et al. | |
| 6,153,541 A * | 11/2000 | Yao | H01L 21/3145 257/E21.029 |
| 6,713,831 B1 | 3/2004 | Sadoughi et al. | |
| 6,831,015 B1 * | 12/2004 | Inoue et al. | 438/692 |
| 7,696,094 B2 | 4/2010 | Matsumoto et al. | |
| 2002/0034874 A1 * | 3/2002 | Aoki | 438/689 |
| 2002/0125544 A1 * | 9/2002 | Koishikawa | 257/510 |
| 2002/0127866 A1 * | 9/2002 | Kwean et al. | 438/694 |
| 2002/0134754 A1 | 9/2002 | Kim | |
| 2002/0145915 A1 * | 10/2002 | Ogura et al. | 365/185.28 |
| 2002/0154425 A1 * | 10/2002 | Aigner et al. | 359/860 |
| 2002/0155698 A1 * | 10/2002 | Lyer | G03F 7/091 438/636 |
| 2003/0203515 A1 | 10/2003 | Lin et al. | |
| 2005/0248717 A1 * | 11/2005 | Howell et al. | 351/41 |
| 2005/0271377 A1 * | 12/2005 | Hong | 396/211 |
| 2012/0248597 A1 * | 10/2012 | Enda et al. | 257/734 |

FOREIGN PATENT DOCUMENTS

| | | |
|---|---|---|
| JP | 2001085373 | 3/2001 |
| JP | 2001085373 A | 3/2001 |
| JP | 2004146582 A | 5/2004 |
| JP | 2004228519 A | 8/2004 |
| WO | 0221581 A2 | 3/2002 |
| WO | WO0221581 A2 | 3/2002 |

OTHER PUBLICATIONS

USPTO Final Rejection for U.S. Appl. No. 11/480,207 dated Oct. 18, 2010; 17 pages.
USPTO Final Rejection for U.S. Appl. No. 11/480,207 dated Nov. 13, 2009; 19 pages.
USPTO Non-Final Rejection for U.S. Appl. No. 11/480,207 dated Feb. 15, 2011; 16 pages.
USPTO Non-Final Rejection for U.S. Appl. No. 11/480,207 dated Apr. 27, 2010; 27 pages.
USPTO Non-Final Rejection for U.S. Appl. No. 11/480,207 dated May 13, 2009; 23 pages.
USPTO Non-Final Rejection for U.S. Appl. No. 11/480,207 dated Aug. 22, 2011; 21 pages.
USPTO Notice of Allowance for U.S. Appl. No. 11/480,207 dated Apr. 27, 2012; 9 pages.

* cited by examiner

SEMICONDUCTOR DEVICE WITH STOP LAYERS AND FABRICATION METHOD USING CERIA SLURRY

CROSS-REFERENCES TO RELATED APPLICATIONS

This application is a Divisional Application of and claims priority to U.S. patent application Ser. No. 11/480,207, filed on Jun. 29, 2006, titled "SEMICONDUCTOR DEVICE WITH STOP LAYERS AND FABRICATION METHOD USING CERIA SLURRY," by Enda, et al, which is a continuation in part of International Application No. PCT/JP2005/011965, filed Jun. 29, 2005 which was not published in English under PCT Article 21(2), which are herein incorporated by reference.

BACKGROUND OF THE INVENTION

1. Field of the Invention

This invention relates generally to semiconductors and fabrication methods therefor, and more particularly, to a semiconductor device and a fabrication method therefor with the use of CMP.

2. Description of the Related Art

In order to enhance the performance of semiconductor devices and reduce the costs thereof, development of the layout rule is in progress for the purposes of reducing the size. In this development, planarization technique plays an important role. For instance, if poor planarization is provided on a plane on which the lithography process is performed, there will cause problems of misaligned focus, difficulty in the formation of a minute pattern, and the like. As a representative planarization method, polishing with the use of Chemical Mechanical Polishing (CMP) is known.

With reference to FIG. 1A (Prior Art) through FIG. 3C (Prior Art), a description will be given of a planarization method with the use of a conventional CMP technique. FIG. 1A (Prior Art) through FIG. 1C (Prior Art) show a case where a silicon oxide film is embedded for element isolation (conventional technique 1), and an insulating film is planarized by using a silicon nitride film as a stop layer. Referring now to FIG. 1A (Prior Art), a silicon nitride film is formed on a semiconductor substrate 10 as a stop layer 12 used for polishing. A given region of the stop layer 12 is removed, and a trench is formed in the semiconductor substrate 10. A silicon oxide film is formed in the trench and on the stop layer 12 as a cover film 16. Referring to FIG. 1B (Prior Art), the cover film 16 is polished to the stop layer 12 by CMP. Referring to FIG. 1C (Prior Art), the stop layer 12 is removed and an embedded silicon oxide film 18 is provided in the trench formed in the semiconductor substrate 10.

FIG. 2A (Prior Art) and FIG. 2B (Prior Art) show a case where an insulating film provided between metal layers on the substrate is planarized by using the metal layers as a stopper (conventional technique 2). Referring now to FIG. 2A (Prior Art), metal layers 30 made of polysilicon films are formed on the semiconductor substrate 10, and a cover film 34 of, for example, a silicon oxide film or the like is formed so as to cover the metal layers 30. Referring to FIG. 2B (Prior Art), the insulating film 34 is polished by CMP, and insulating film layers 36 are formed between the metal layers 30.

FIG. 3A (Prior Art) through FIG. 3C (Prior Art) show a case where a multilayer interconnection is formed and the insulating film is planarized without the stop layer (conventional technique 3). Referring now to FIG. 3A (Prior Art), wiring layer 50a made of aluminum are formed on the semiconductor substrate 10, and an interlayer insulating film 52 is formed. Referring to FIG. 3B (Prior Art), wiring layers 60 are formed on the interlayer insulating film 52. An interlayer insulating film 65 of a silicon oxide film or the like is formed to cover the wiring layers 60. Referring to FIG. 3C (Prior Art), the interlayer insulating film 65 is polished by CMP. Subsequently, on the interlayer insulating film 65, the wiring layer and the interlayer insulating film are provided on an upper layer, thereby making it possible to form a desired multilayer interconnection.

Also, Japanese Patent Application Publication No. 2004-146582, Japanese Patent Application Publication No. 2004-228519, and Japanese Patent Application Publication No. 2001-85373 disclose polishing methods in which a silicon nitride film is employed as a stop layer with the use of an abrasive that includes abrasive grains of cerium oxide, also known as ceria slurry.

The conventional planarization techniques, however, have the following drawbacks. In the conventional technique 1, as shown in FIG. 1C (Prior Art), the silicon oxide film 18 is polished more than the stop layer 12 is polished. In addition, in the conventional technique 2, as shown in FIG. 2B (Prior Art), a middle portion of the insulating film 36 provided between the metal layers 30 becomes thinner. This phenomenon is called dishing. In the conventional technique 3, as shown in FIG. 3C (Prior Art), the interlayer insulating film 65 does not exhibit excellent planarization. As stated, in the conventional techniques, there is room to improve planarization properties.

SUMMARY OF THE INVENTION

The present invention has been made in view of above circumstances and it is an object of the invention to provide a semiconductor device having a film of excellent planarization on a surface thereof and fabrication method therefor.

According to a first aspect of the present invention, there is preferably provided a method of fabricating a semiconductor device including: forming stop layers that include silicon oxy-nitride films above a semiconductor substrate; forming a cover film between and on the stop layers, in which a top surface of the cover film above a region between the stop layers is higher than top surfaces of the stop layers; and polishing the cover film to the stop layers by using ceria slurry. According to the present invention, it is possible to obtaining the film having a surface of excellent planarization.

According to a second aspect of the present invention, there is preferably provided a method of fabricating a semiconductor device including: forming a first interlayer insulating film above a semiconductor substrate; forming a first layer that includes wiring layers partially above the first interlayer insulating film; forming a cover film between and on the first layers, so that a top surface of the cover film above a region between stop layers is higher than top surfaces of the first layers; forming an embedded layer between the first layers, by polishing the cover film to the first layers; and forming a second interlayer insulating film on the first layers. According to the present invention, after the cover layer is polished to the first layer and planarized, the second interlayer insulating film can be formed. It is therefore possible to offer the second interlayer insulating film having a surface of excellent planarization. Accordingly, the second interlayer insulating film is capable of having a surface of excellent planarization. This makes it possible to miniaturize the wiring on an upper layer.

According to a third aspect of the present invention, there is preferably provided a semiconductor device including: metal layers provided above a semiconductor substrate; silicon oxynitride films provided on the metal layers; and an embedded layer provided between the metal layers to have a top surface substantially coplanar with top surfaces of the silicon oxynitride films. According to the present invention, it is possible to provide a semiconductor device having a film of excellent planarization.

According to a fourth aspect of the present invention, there is preferably provided a semiconductor device including: a first interlayer insulating film provided above a semiconductor substrate; first layers provided partially on the first interlayer insulating film, the first layers including wiring layers; an embedded layer provided on the first interlayer insulating film between the first layers to have a top surface substantially coplanar with top surfaces of the first layers; and a second interlayer insulating film formed on the first layers and on the buried layer. According to the present invention, it is possible to planarize the surface of the second interlayer insulating film, thereby miniaturizing wiring on an upper layer.

BRIEF DESCRIPTION OF THE DRAWINGS (Prior Art) FIG. 1A through FIG. 1C show cross-sectional views illustrating a fabrication method of a semiconductor device according to a conventional technique 1;

(Prior Art) FIG. 2A and FIG. 2B show cross-sectional views illustrating a fabrication method of a semiconductor device according to a conventional technique 2;

(Prior Art) FIG. 3A through FIG. 3C show cross-sectional views illustrating a fabrication method of a semiconductor device according to a conventional technique 3;

FIG. 7A is a graph showing depth with respect to a scanning distance, and FIG. 7B is a top view of a scanned region of the recess;

DESCRIPTION OF THE PREFERRED EMBODIMENTS

A description will now be provided, with reference to the accompanying drawings, of embodiments of the present invention.

First Embodiment

Figure 4A:
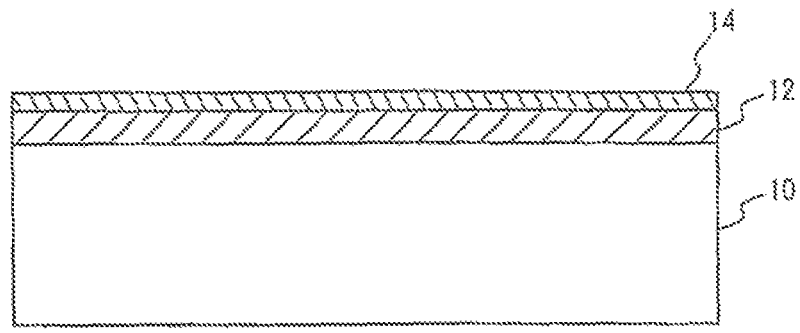
FIG. 4A through FIG. 4C show first cross-sectional views illustrating a fabrication method of a semiconductor device in accordance with a first embodiment of the present invention.
Figure 4B:
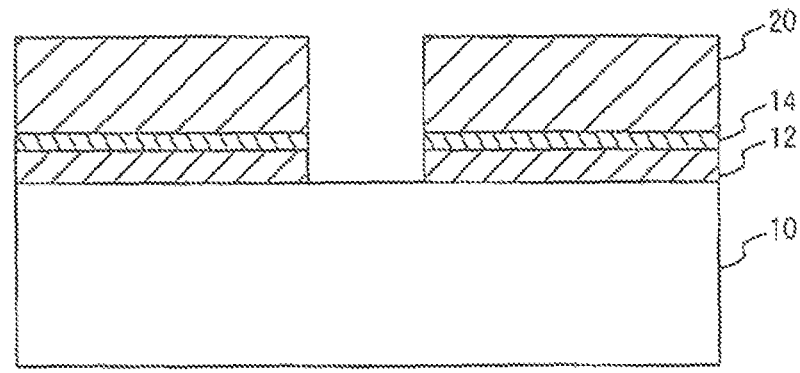
Figure 4C:
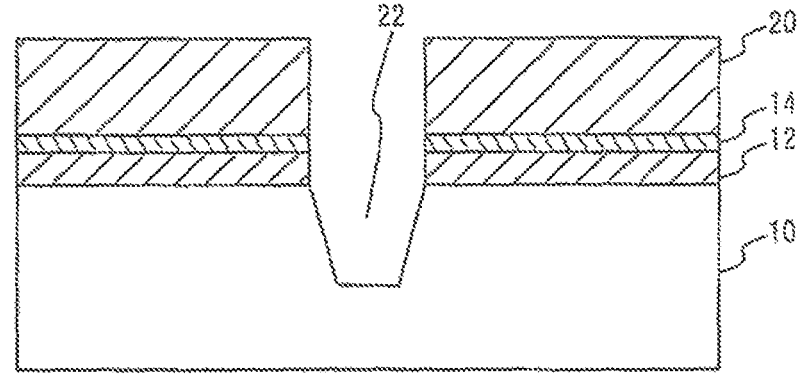

A first embodiment of the present invention describes an example of forming an embedded silicon oxide film for element isolation and an insulating film is planarized by using a silicon nitride film as a stop layer. FIG. 4A through FIG. 5C are cross-sectional views illustrating a fabrication method of a semiconductor device in accordance with the first embodiment. Referring now to FIG. 4A, a silicon nitride film 12 having a thickness of approximately 100 nm is formed on a silicon substrate 10. On the silicon nitride film 12, a stop layer 14 that includes a silicon oxy-nitride film having a thickness of approximately 35 nm is formed. In one embodiment, this film has a thickness of 10 nm to 50 nm. Referring to FIG. 4B, a photoresist film 20 is applied onto the stop layer 14, and a given region of the photoresist film 20 is exposed with the use of a normal lithography process and then removed during the photoresist development process. The stop layer 14 and the silicon nitride film 12 are etched away with the use of the photoresist film 20 as a mask. The stop layer 14 (a layer to become the stop layer) is used as an antireflective film at the time of exposing the photoresist film 20. Therefore, the thickness of the stop layer 14 is determined in such a manner that the reflection is avoided during the lithography process. Referring now to FIG. 4C, the semiconductor substrate 10 is etched away by using the photoresist film 20 as a mask, and a trench 22 is formed.

Figure 5A:
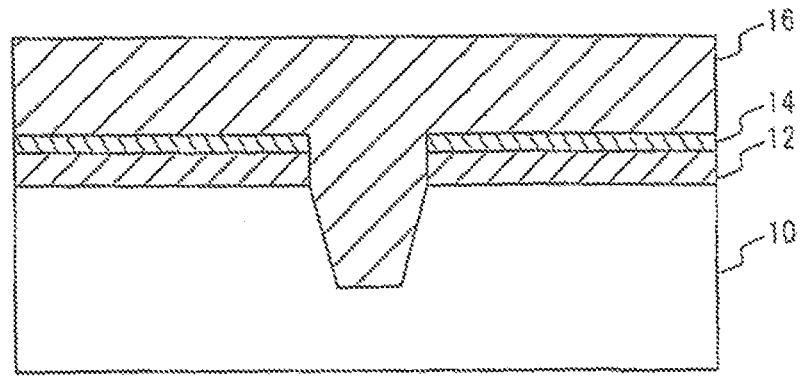
FIG. 5A through FIG. 5C show second cross-sectional views illustrating the fabrication method of the semiconductor device in accordance with the first embodiment of the present invention.
Figure 5B:
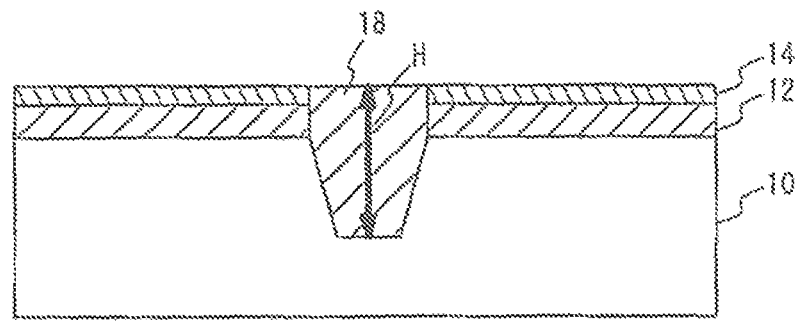

Referring now to FIG. 5A, the photoresist film 20 is removed. Then, a cover layer 16 is formed on the stop layer 14 to fill in the trench 22 and cover the stop layer 14 so that a top surface of the cover film 16 above the trench becomes higher than the top surface of the stop layer 14. A silicon oxide film is deposited by CVD as the cover film 16. Referring now to FIG. 5B, using ceria slurry as an abrasive, the cover film 16 is polished to the stop layer 14. Polishing has been performed under the conditions that the polishing pressure is 4.0 psi, and the rotation number of the wafer is 110 rpm. Here, it is preferable that the polishing pressure is 0.5 psi to 8.0 psi, and the rotation number of the wafer is 40 rpm to 200 rpm. In this manner, the silicon oxide film 18 is embedded in the trench formed in the semiconductor substrate 10.

Figure 5C:
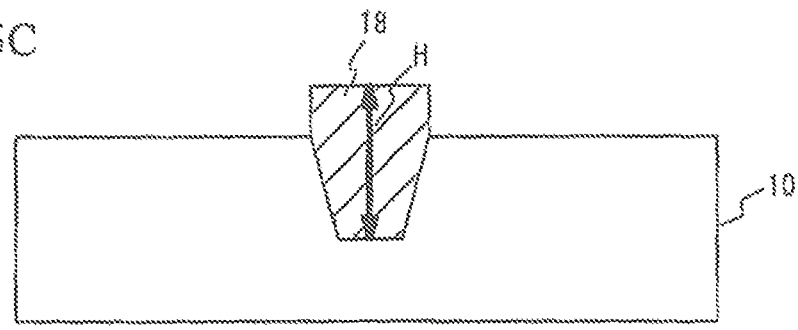

Referring now to FIG. 5C, the stop layer 14 made of the silicon oxy-nitride film is removed by a hydrofluoric acid-based solution. The silicon nitride film 12 is used as a protection film in a subsequent fabrication process, and is finally removed by a phosphoric acid-based solution. In one embodiment, the silicon oxide film 18 has a thickness H of 400 nm or more so as to achieve a high breakdown voltage between isolated elements. In one embodiment, a faster etch rate with the hydrofluoric acid-based solution is employed for etching the stop layer 14 so as to obtain the etching selectivity with the silicon nitride film 12 during the removal of the stop layer 14.

Figure 6:
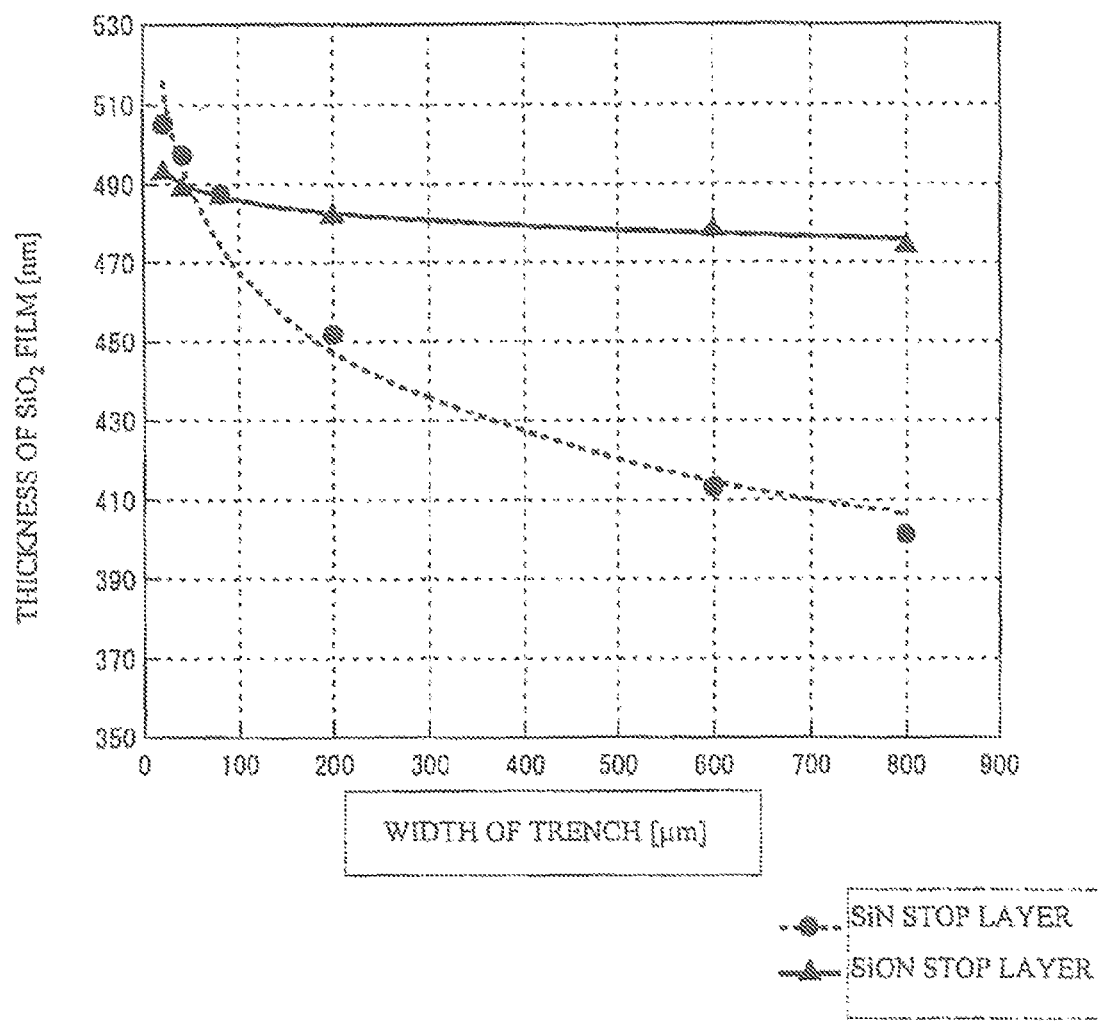
FIG. 6 is a graph showing a relationship between width of a recess and thickness of a silicon oxide film provided on the recess in the semiconductor device, which is formed by the fabrication method in accordance with the first embodiment of the present invention.

FIG. 6 shows measurement results of thickness of the silicon oxide film 18 around a center of the trench 22, while the width of the trench 22 is being varied. A solid line represents a result of the first embodiment of the present invention, and a dashed line represents a conventional technique. As the conventional technique, a silicon nitride film is used as the stop layer, ceria slurry is used as an abrasive, and the cover film 16 is polished to the stop layer. According to a conventional technique, as the width of the trench 22 is wider, the thickness of the silicon oxide film 18 becomes thinner. However, in the first embodiment, the thickness of the silicon oxide film 18 does not change so much.

Figure 7A:
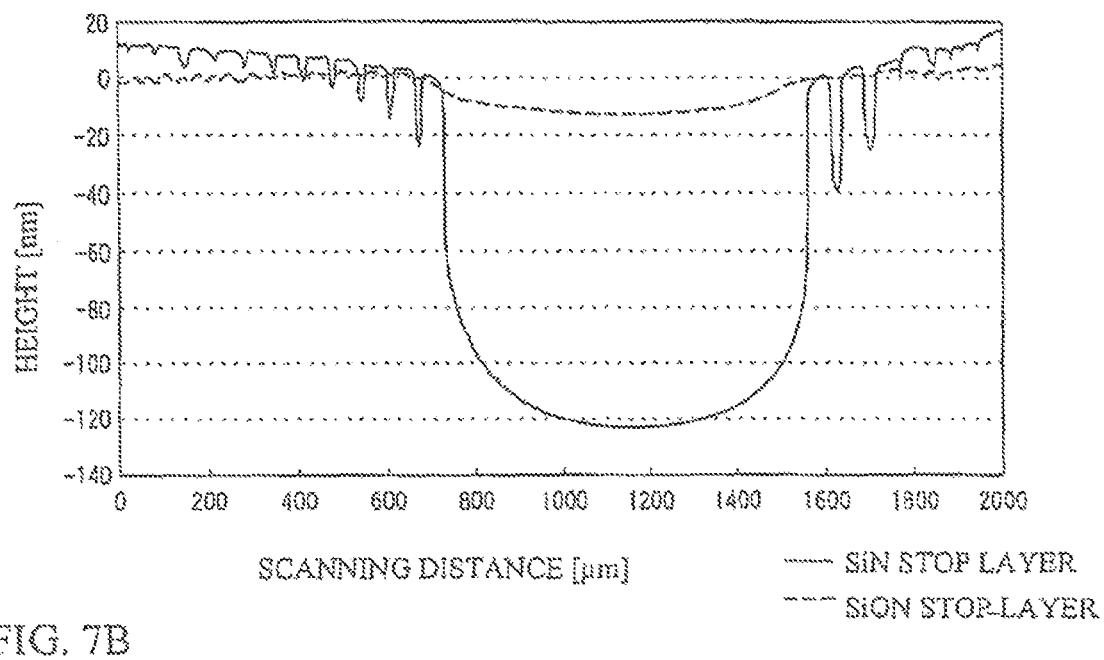
FIG. 7A and FIG. 7B are views showing measurement results of step heights measured with the use of a surface profiler for measuring step height with a probe.
Figure 7B:
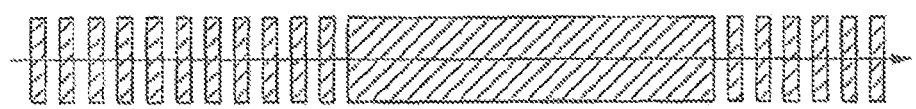

FIG. 7A and FIG. 7B show measurement results of depth of the trench 22 by use of a surface profiler for measuring step height with a probe. The horizontal axis denotes a scanning distance of the instrument for measuring the step height with a probe. The vertical axis denotes the step height of the silicon oxide film 18 above the trench. FIG. 7B is a top view of a scanned region. The largest pattern is 800 µm in length and 600 µm in width. In this pattern, a dent of approximately 120 nm is produced in the conventional technique (solid line), whereas a dent of approximately 10 nm is produced in the first embodiment (dashed line). This demonstrates that the difference in the step heights is reduced above the trench in the first embodiment of the present invention. According to the results demonstrated in FIG. 6, FIG. 7A, and FIG. 7B, the degree of dishing is suppressed and planarization is excellent on the surface of the silicon oxide film 18 in the first embodiment of the present invention, as compared to the surface thereof in the conventional technique.

As stated heretofore, according to the first embodiment, the stop layer 14 that includes a silicon oxy-nitride film is partially formed above the semiconductor substrate 10. The cover film 16 is formed between the stop layers 14 and on the stop layer 14 in such a manner that the top surface above the trench (a region between the stop layers 14) becomes higher than the top surface of the stop layer 14. Subsequently, ceria slurry is used as an abrasive to polish the cover film 16 to the stop layer 14. This makes it possible to obtain the silicon oxide film 18 having a surface with excellent planarization.

According to the inventors' assessment, the excellent planarization is obtainable in the silicon oxy-nitride film used for the stop layer 14, within a range of 1.8 to 2.3 in a refractive index (N) and within a range of 0.1 to 1.5 in an absorption coefficient (K). In FIG. 6 through FIG. 7B, the silicon nitride film used for the stop layer in the conventional technique has a range of 2.0 to 2.3 in the refractive index (N) and a range of 0 to 0.04 in the absorption coefficient (K). Within the afore-described ranges, the excellent planarization is not obtainable. Accordingly, the planarization of the surface of the silicon oxide film 18 can be enhanced by using the silicon oxy-nitride film having the absorption coefficient (K) of 0.1 or more, as the stop layer 14.

Figure 8:
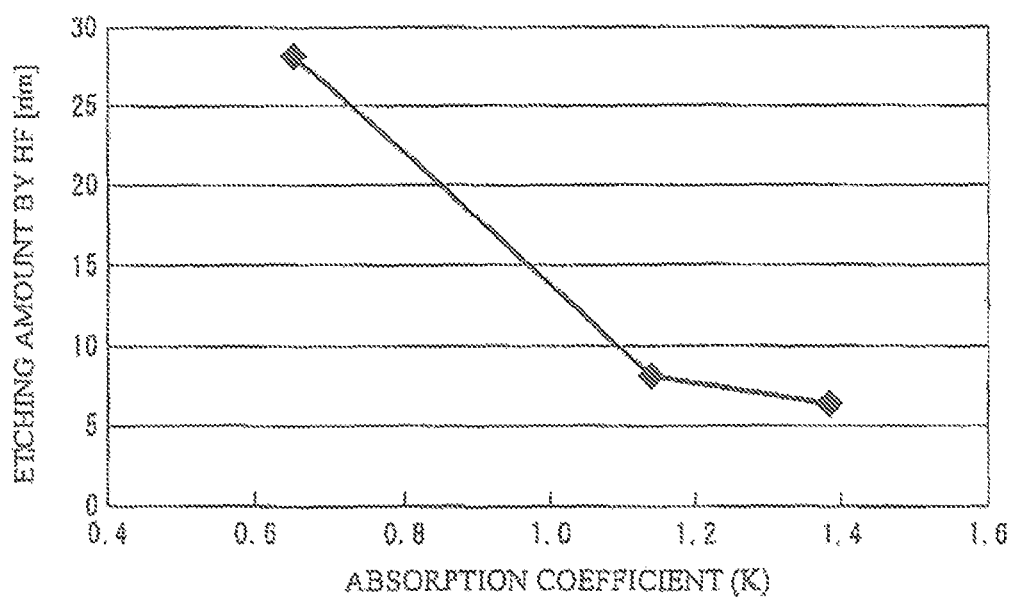
FIG. 8 is a graph showing etching amounts with the use of a hydrofluoric acid solution with respect to an absorption coefficient (K)

In FIG. 5C, when the silicon oxy-nitride film (stop layer) is removed, it is desirable that the absorption coefficient (K) is small so as to obtain the etching selectivity with the silicon nitride film. FIG. 8 is a graph showing etching amounts when the etch process is performed on the silicon oxy-nitride film having various absorption coefficients (K) for three minutes, with the use of a hydrofluoric acid solution ($H_2O$:HF=100:2). The etching amount is approximately 8 nm when K is approximately 1.15, and the etching amount is approximately 6 nm when K is approximately 1.4. In contrast, the etching amount is approximately 28 nm when K is approximately 0.6. In view of the afore-described etching amounts, the silicon oxy-nitride film having K of approximately 1.1 is employed in the first embodiment. As stated, it is preferable that K falls in a range of 0.1 to 1.4.

The trench 22 is formed in the semiconductor substrate 10 by etching the semiconductor substrate 10, and the cover film 16 is embedded in the trench 22 and formed on the stop layer 14. This enables such embedded silicon oxide film to be plane, also in a fabrication method that forms an element isolation region of the embedded silicon oxide film.

As shown in FIG. 4B, the stop layer 14 is formed by etching the silicon oxy-nitride film to be the stop layer. The trench 22 shown in FIG. 4C is formed by etching the semiconductor substrate 10 with the use of the mask (photoresist film 20), which is used for etching the stop layer 14. In this manner, an identical mask is used for etching the stop layer 14 and etching the trench 22, thereby making it possible to shorten the fabrication process.

The silicon nitride film is formed on the semiconductor substrate 10, as shown in FIG. 4A, and the silicon nitride film is etched to form the silicon nitride layer 12, as shown in FIG. 4B. The process of forming the stop layer 14 includes a process of forming the stop layer on the silicon nitride film. In addition, the trench 22 is formed by etching the semiconductor substrate 10 with the use of the mask (photoresist film 20) used for etching the stop layer 14 and etching for forming the silicon nitride layer 12. It is therefore possible to shorten the fabrication process by employing an identical mask for etching the stop layer 14 and etching for forming the silicon nitride layer 12 and the trench 22.

As shown in FIG. 4B, the photoresist film 20 that is provided on a layer to become the stop layer 14, as a mask for forming the trench 22. Then, the stop layer 14 is used as an antireflective film while the photoresist film 20 is being exposed. This enables to form a minute photoresist pattern and reduce the size of the trench 22. Also, it is possible to reduce the step of the fabrication process by using the stop layer also as the antireflective film.

The cover film 16 is easy to be polished, if the cover film 16 is an insulating film, in particular, a silicon oxide film, as described in the first embodiment. For this reason, the planarization is easily degraded on the surface of the insulating film after polishing. Accordingly, it is possible to obtain the insulating film having excellent planarization, by applying the present invention.

Second Embodiment

Figure 9A:
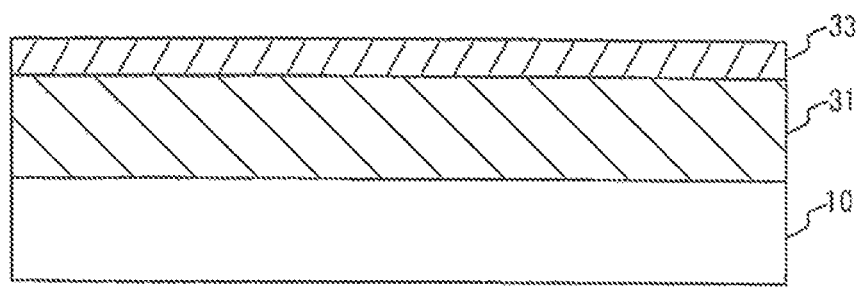
FIG. 9A through FIG. 9D show first cross-sectional views illustrating a fabrication method of a semiconductor device in accordance with a second embodiment of the present invention.

A second embodiment describes an example of planarizing a surface of an insulating film formed on a metal layer provided on a substrate. FIG. 9A through FIG. 9D are cross-sectional views illustrating a fabrication method of a semiconductor device in accordance with the second embodiment. Referring now to FIG. 9A, a polysilicon film is formed on the silicon semiconductor substrate 10, as a metal layer. For instance, in a case where the metal layer is used as a gate electrode, an insulating film made of a gate oxide film or the like is formed on the semiconductor substrate 10, and a metal film 31 is formed thereon. The afore-described insulating film is not shown in FIG. 9A through FIG. 9D. A silicon oxy-nitride film 33 to become a stop layer 32 is formed on the metal film 31. In one embodiment, the metal film 31 and the silicon oxy-nitride film 33 respectively have a thickness of approximately 200 nm to 400 nm and a thickness of approximately 10 nm to 50 nm.

Figure 9B:
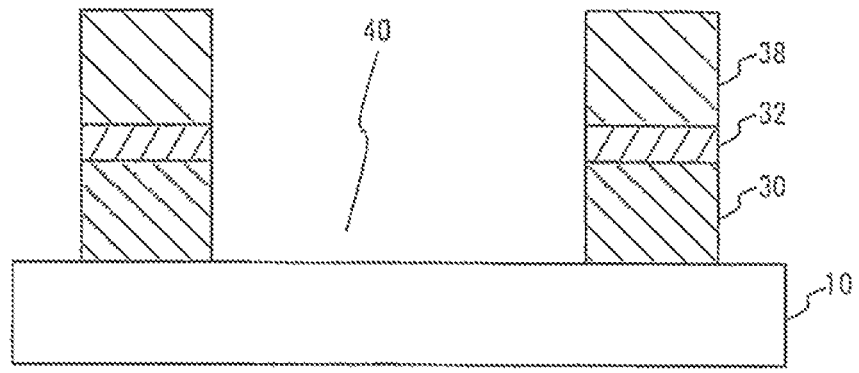

Referring now to FIG. 9B, a photoresist film 38 having openings 40 is formed on the silicon oxy-nitride film 33. The silicon oxy-nitride film 33 and the metal film 31 are etched away to form the stop layers 32 and the metal layers 30.

Figure 9C:
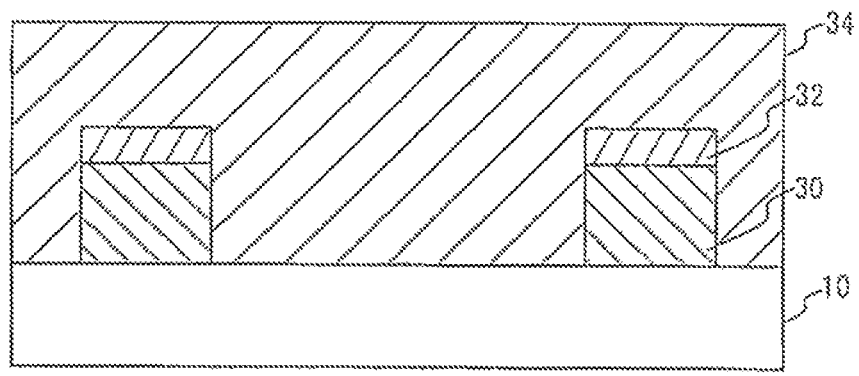

Referring now to FIG. 9C, the photoresist film 38 is removed. Subsequently, a cover film 34 is formed in a region between the metal layers 30 and between the stop layers 32, and is also formed on the stop layers 32. The cover film 34 is formed in such a manner that the top surfaces of the regions between the metal layers 30 and between the stop layers 32 become higher than the top surfaces of the stop layers 32 to cover the metal layers 30 and the stop layers 32. A silicon oxide film having a thickness of 1.5 µm is formed by Chemical Vapor Deposition (CVP) and is employed for the cover film 34. In one embodiment, the silicon oxide film has a thickness of approximately 1.0 µm to 2.0 µm.

Figure 9D:
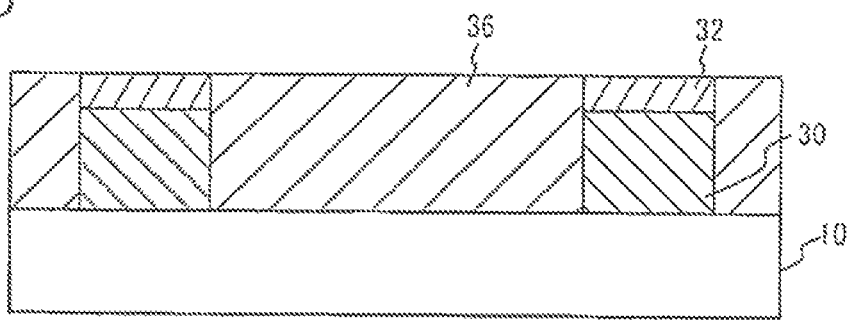

Referring to FIG. 9D, the cover film 34 is polished to the stop layers 32 with the use of ceria slurry as an abrasive. The polishing conditions are identical to those used in the first embodiment. Accordingly, embedded layers 36 having plane surfaces is formed between the metal layers 30 and between the stop layers 32.

In accordance with the second embodiment, the metal layer 30 is partially formed on the semiconductor substrate, and the stop layers 32 that include silicon oxide films are formed on the metal layers 30. Subsequently, as shown in FIG. 9C, the cover film 34 is formed between the metal layers 30 and on the stop layer 32 in such a manner that the top surfaces of the regions between the metal layers 30 and between the stop layers 32 become higher than the top surfaces of the stop layers 32. Then, as shown in FIG. 9D, the cover film 34 is polished to the stop layers 32 with the use of the ceria slurry. This offers a semiconductor device having the metal layers 30 partially provided on the semiconductor substrate 10, the silicon oxy-nitride films 32 provided on the metal layer 30, and the embedded layers 36 provided on the semiconductor substrate 10 between the metal layers 30 to have a surface substantially coplanar with the surfaces of the silicon oxy-nitride films 32. Here, substantially coplanar denotes that the silicon oxy-nitride films 32 and the embedded layer 36 substantially have a coplanar surface after polishing.

In the semiconductor device and the fabrication method therefor in accordance with the second embodiment, it is possible to improve the planarization of the surfaces of the embedded layers 36, even in a case where the embedded layers 36 are formed between the metal layers 30. In particular, in a case where the insulating film is embedded in the metal layer, the planarization easily becomes poor on the surface of the insulating film after polishing. However, the excellent planarization is obtainable by applying the present invention.

As shown in FIG. 9B, the metal film 31 to become the metal layer 30 is etched with the use of the mask (photoresist film 38), which is used for etching the stop layers 32. In this manner, the fabrication process can be shortened by using an identical mask used for etching the stop layers 32 and for etching the metal layers 30.

Third Embodiment

Figure 1A:
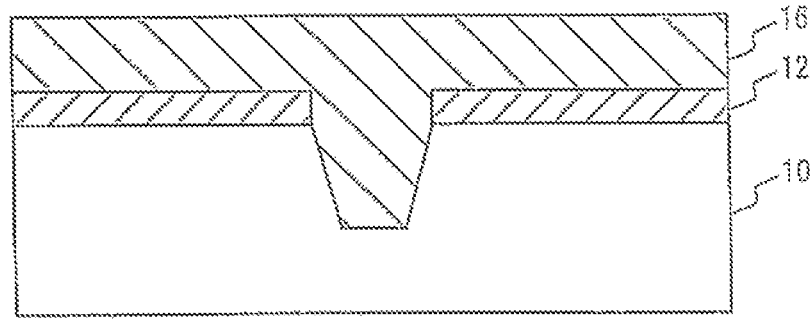
Figure 1B:
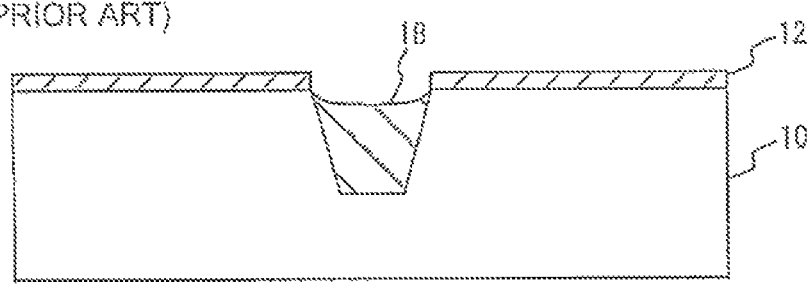
Figure 1C:
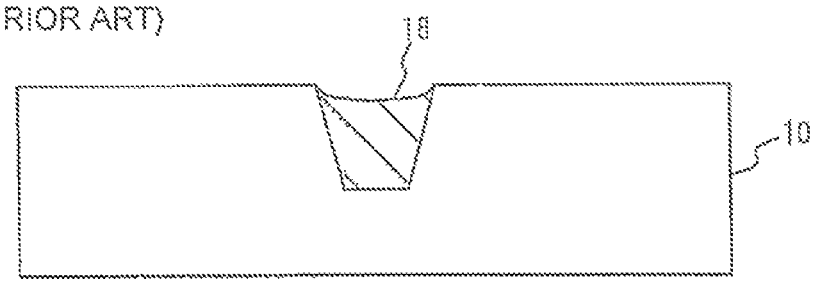
Figure 2A:
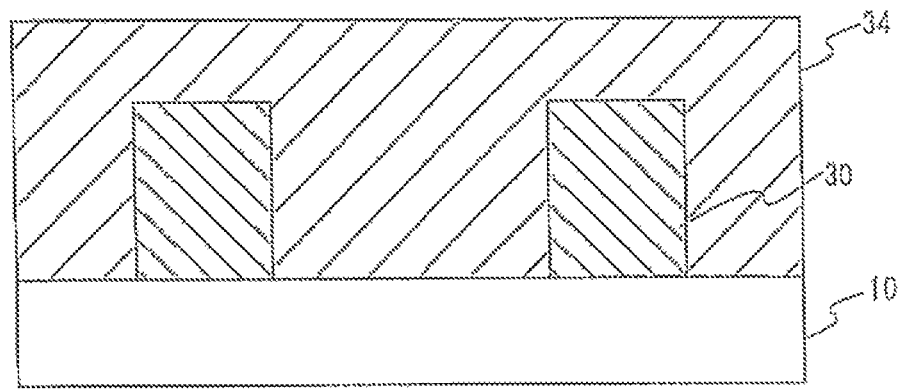
Figure 2B:
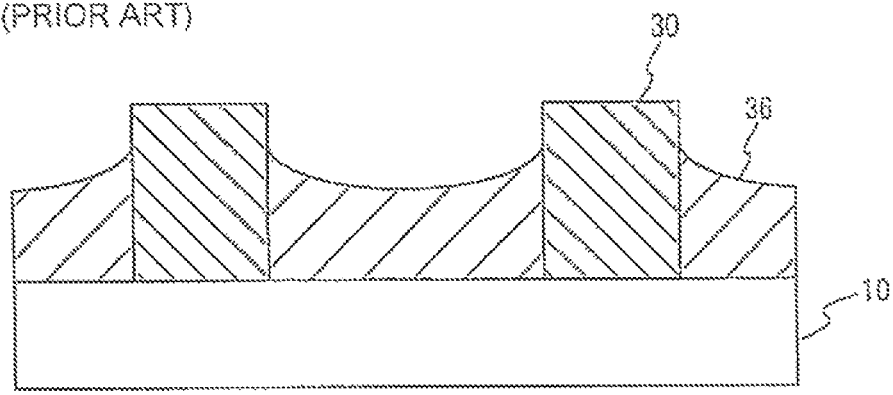
Figure 3A:
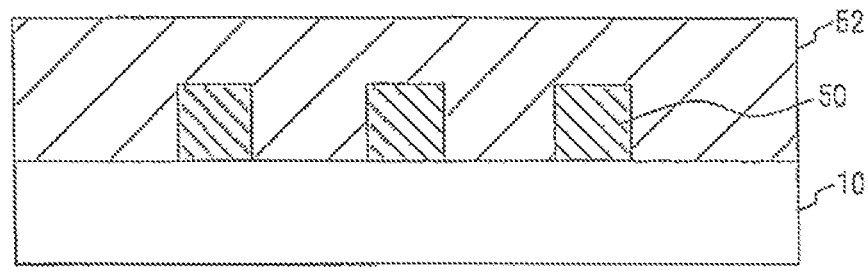
Figure 3B:
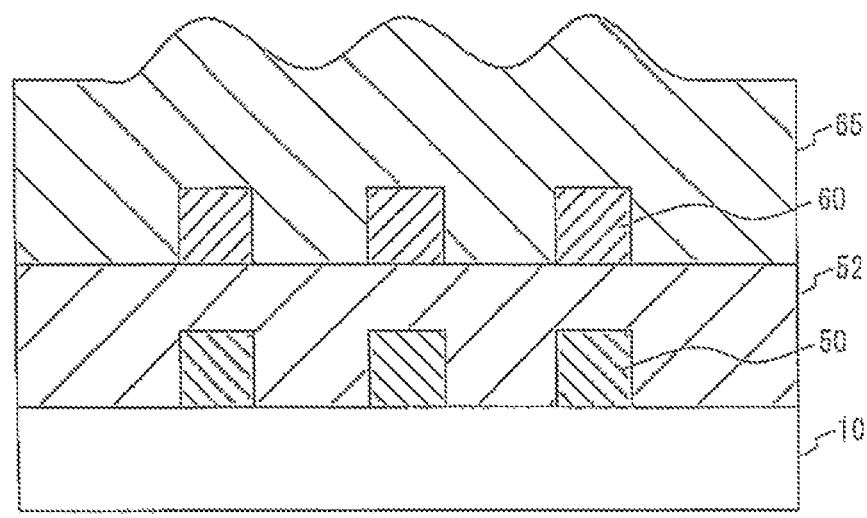
Figure 3C:
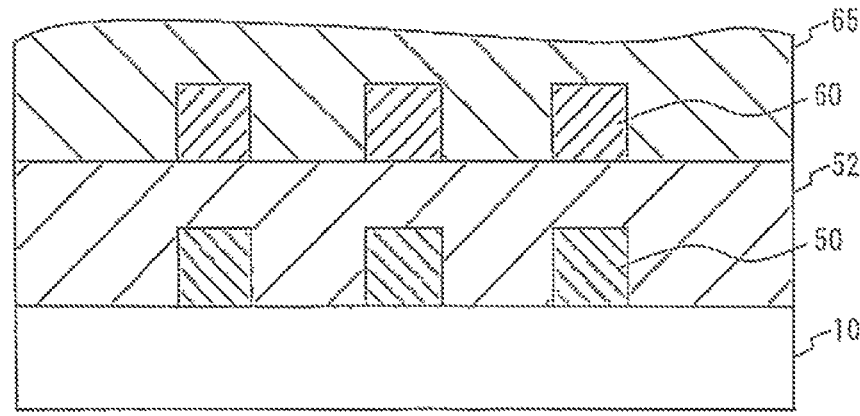
Figure 10A:
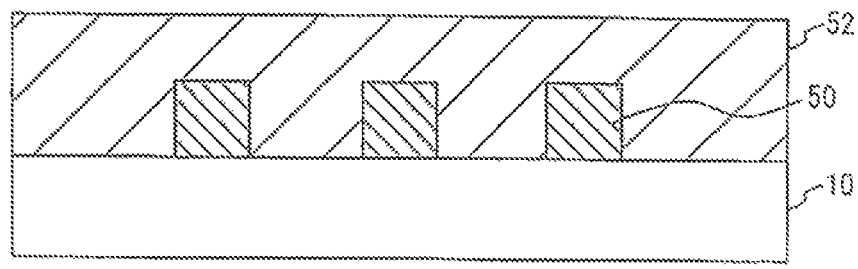
FIG. 10A through FIG. 10C show first cross-sectional views illustrating a fabrication method of a semiconductor device in accordance with a third embodiment of the present invention.

A third embodiment describes an example of forming a multilayer wiring on the substrate. FIG. 10A through FIG. 11C are cross-sectional views illustrating a fabrication method of the semiconductor device in accordance with the third embodiment of the present invention. Referring now to FIG. 10A, on the semiconductor substrate 10, wiring layers 50 and a first interlayer insulating film 52 are formed. The wiring layers 50 and the first interlayer insulating film 52 are formed in a similar manner that wiring layers 60 shown in FIG. 10B through FIG. 11C, which will be described later, are replaced by the wiring layers 50 and a second interlayer insulating film 66 and an embedded layer 64 are replaced by the first interlayer insulating film 52, or in a similar manner that the wiring films 60 shown in FIG. 3B and FIG. 3C are replaced by the wiring layers 50 and the first interlayer insulating film 65 are replaced by the first interlayer insulating film 52. The wiring layers 50 mainly include aluminum, and the first interlayer insulating film 52 mainly includes a silicon oxide film. Also, a lower wiring layer or an operation layer of transistor and the like is formed between the wiring layers 50 and the first interlayer insulating film 52 and the semiconductor substrate 10, although these are not shown in FIG. 10A through FIG. 10 C.

Figure 10B:
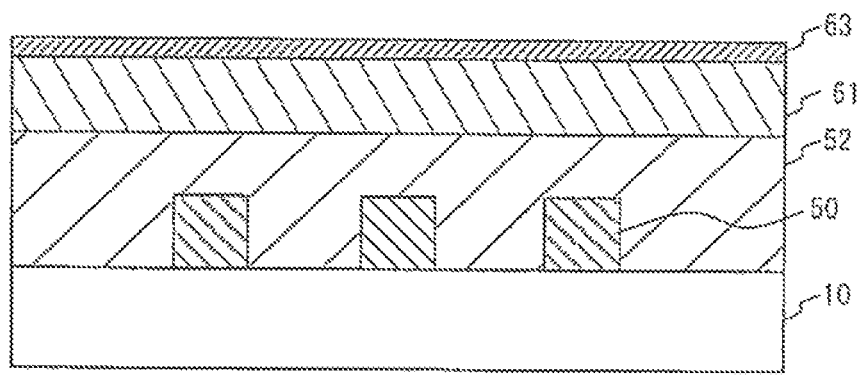

Referring now to FIG. 10B, a metal film 61 that mainly includes aluminum having a thickness of approximately 500 nm is formed on the first interlayer insulating film 52. In one embodiment, the first interlayer insulating film 52 has a thickness of approximately 200 nm to 800 nm. A silicon oxy-nitride film 63 having a thickness of approximately 30 nm is formed on the metal film 61. In one embodiment, the silicon oxy-nitride film 63 has a thickness of approximately 10 nm to 50 nm.

Figure 10C:
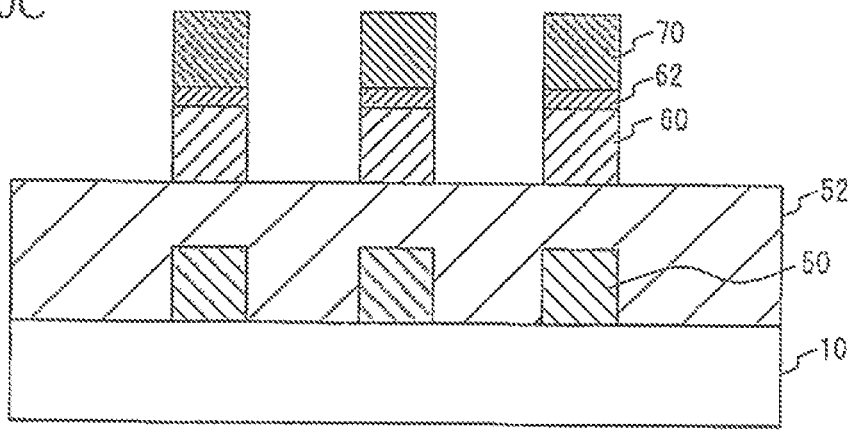

Referring to FIG. 10C, a photoresist film 70 having openings is formed on the silicon oxy-nitride film 63. The silicon oxy-nitride film 63 and the metal film 61 are etched away by using the photoresist film 70 as a mask. This produces stop layers 62 and the wiring layers 60.

Figure 11A:
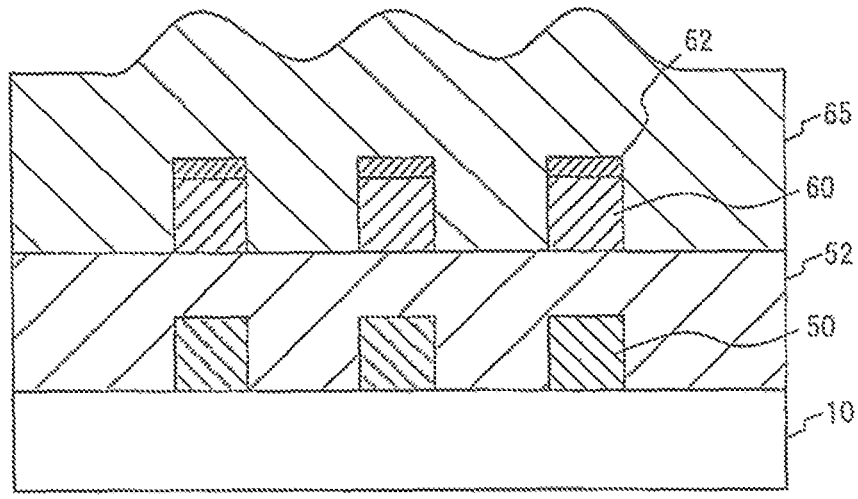
FIG. 11A through FIG. 11C show second cross-sectional views illustrating the fabrication method of the semiconductor device in accordance with the third embodiment of the present invention.

Referring to FIG. 11A, the photoresist film 70 is removed. Then, a cover film 65 is formed between the wiring layers 60 and the stop layers 62 and on the stop layers 62. The cover film 65 is formed in such a manner that a top surface of the cover film 65 in regions above the wiring layers 60 and the stop layers 62 is higher than the top surfaces of the stop layers 62 to cover the wiring layers 60 and the stop layers 62. As the cover film 65, a silicon oxide film having a thickness of 1.5 µm is deposited by CVD. In one embodiment, the cover film 65 has a thickness of 1.0 µm to 2.0 µm.

Figure 11B:
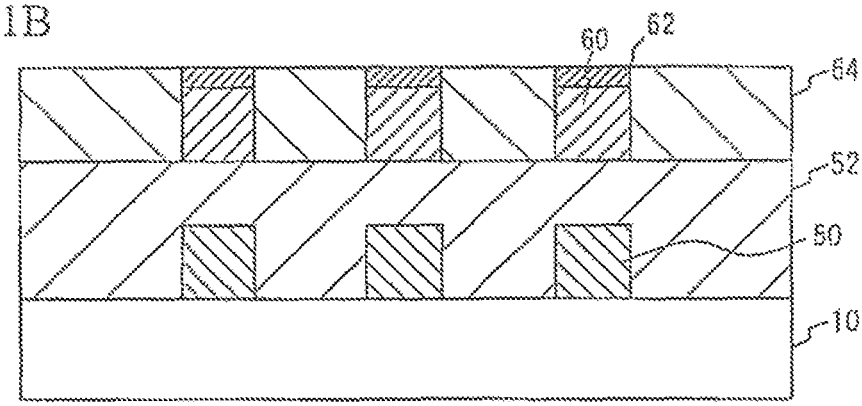
Figure 11C:
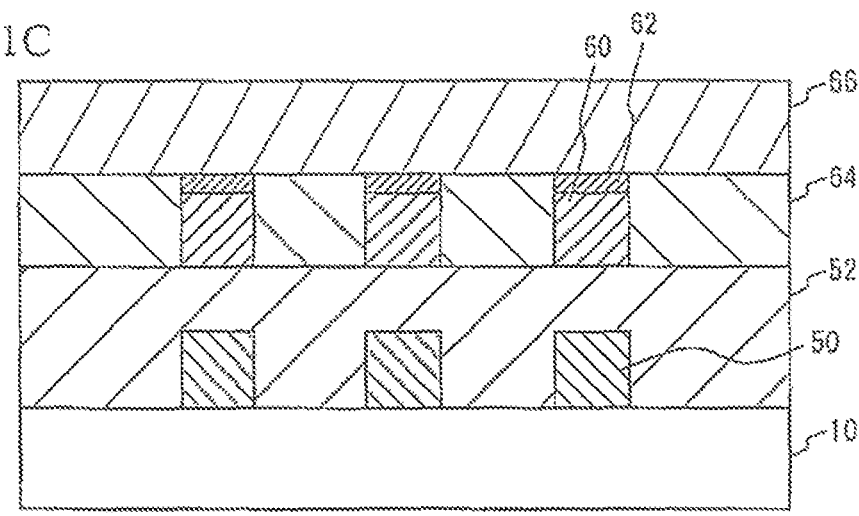

Referring to FIG. 11B, the cover film 65 is polished to the stop layers 62 with the use of ceria slurry as an abrasive. The polishing conditions are identical to those used in the first embodiment. Accordingly, the embedded layer 64 having a plane surface is formed between the wiring layers 60 and between the stop layers 62. Referring to FIG. 11C, the second interlayer insulating film 66 is deposited on the stop layers 62 and on the embedded layers 64 by CVD. As required, a wiring layer and an interlayer insulating film may be formed on an upper layer in a similar manner. The wiring layer may be composed of either one layer or multiple layers. This selection depends of the requirement for the planarization.

In accordance with the third embodiment, as shown in FIG. 10A, the first interlayer insulating film 52 is formed on the semiconductor substrate 10. As shown in FIG. 10C, the wiring layers 60 are partially formed above the first interlayer insulating film 52, and the stop layers 62 are formed on the wiring layers 60. As shown in FIG. 11A, the cover film 65 is formed in such a manner that the top surface of the cover film 65 in the regions between the wiring layers 60 and between the stop layers (first layer) 62 and on the stopper layers 62 is higher than the top surfaces of the stop layers 62. As shown in FIG. 11B, the embedded layer 64 is formed between the wiring layers 60 and between the stop layers (first layer) 62 by polishing the cover film 65 to the stop layers 62. As shown in FIG. 11C, the second interlayer insulating film 66 is formed on the stopper layers 62. As stated, the embedded layer 64 is provided on the first interlayer insulating film 52 between the wiring layers 60 and between the stop layers (first layer) 62, and substantially has a surface coplanar with the surfaces of the stop layers (first layer) 62. In this manner, the cover film 65 is polished to the stop layers 62 and planarized, and then the second interlayer insulating film 66 can be formed. It is therefore possible to make the second interlayer insulating film 66 have a surface of excellent planarization. This makes it possible to miniaturize the wiring on an upper layer.

According to the conventional technique 3, as shown in FIG. 3B, the second interlayer insulating film 66 is formed on the wiring layers 60, and this makes an uneven surface of the second interlayer insulating film 66. Accordingly, as shown in FIG. 3C, the surface is planarized by polishing the second interlayer insulating film. However, the stop layer cannot be used, thereby resulting in an unsatisfactory surface of the second interlayer insulating film after polishing, in FIG. 3C. Meanwhile, in accordance with the third embodiment of the present invention, as shown in FIG. 10B, the cover film 65 is polished and planarized to form the embedded layer 64, and then as shown in FIG. 10C, the second interlayer insulating film 66 is formed. In this case, the second interlayer insulating film 66 is formed on the wiring layers 60 and on the embedded layer 64, which relatively have excellent planarization properties. It is therefore possible to make the second interlayer insulating film 66 having excellent planarization properties.

In accordance with the third embodiment of the present invention, even if the planarization of the surface of the embedded layer 64 is not excellent to some degree, it is possible to planarize the surface of the second interlayer insulating film 66 in a more excellent manner than polishing is performed without the stop layer as described in the conventional technique 3. It is therefore possible to planarize the surface of the second interlayer insulating film 66 more sufficiently than the technique of the conventional example 3, even if the ceria slurry is not used as an abrasive or the silicon oxy-nitride film is not used as the stop layer.

Furthermore, it is possible to planarize the surface of the embedded layer 64 in a more sufficient manner, by providing the stop layers 62 that include silicon oxy-nitride films formed on the wiring layers 60, using ceria slurry as an abrasive, and polishing the cover film 65 to the stop layers 62. This makes it possible to planarize the surface of the second interlayer insulating film 66 more sufficiently, thereby further reducing the size of an upper wiring.

As shown in FIG. 10C, the stop layers 62 are formed by etching the silicon oxy-nitride film 63 (to become the stop layer), and the wiring layers 60 are formed by etching the metal film 61 with the use of an identical mask (photoresist film 70), which is used for etching the stopper layers 62. In this manner, it is possible to shorten the fabrication process with the use of an identical mask used for etching the stop layers 62 and for etching the wiring layers 60.

Although a few preferred embodiments of the present invention have been shown and described, it would be appreciated by those skilled in the art that changes may be made in these embodiments without departing from the principles and spirit of the invention, the scope of which is defined in the claims and their equivalents.

According to a first aspect of the present invention, there is preferably provided a method of fabricating a semiconductor device including: forming stop layers that include silicon oxy-nitride films above a semiconductor substrate; forming a cover film between and on the stop layers, in which a top surface of the cover film above a region between the stop layers is higher than top surfaces of the stop layers; and polishing the cover film to the stop layers by using ceria slurry.

The above-described method may further include forming a trench in the semiconductor substrate, by etching the semiconductor substrate, and forming the cover film may include forming the cover film in the trench and on the stop layers. According to the present invention, also in a fabrication method of a semiconductor device where an element isolation region is formed with the use of the silicon oxy-nitride film, it is possible to form a planar embedded silicon oxide film.

In the above-described method, forming the stop layers may include etching a layer to become the stop layers; and forming the trench may include etching the semiconductor substrate by using a mask used for etching the stop layers. According to the present invention, it is possible to shorten the fabrication process by using an identical mask used for etching the stopper layers and for etching the recess.

The above-described method may further include: forming a silicon nitride film above the semiconductor substrate; and forming a silicon nitride layer by etching the silicon nitride film. Forming the stop layers may include forming the stop layers on the silicon nitride layer; and forming the trench may include etching the semiconductor substrate by using the mask used for etching the stop layers and the silicon nitride film. According to the present invention, it is possible to shorten the fabrication process by using an identical mask for etching the stopper layers and for etching for forming the silicon nitride layer and the recess.

In the above-described method, a photoresist film formed on the layer to become the stop layers may be used as the mask used for forming the trench; and the layer to become stop layers may also be used as an antireflective film for exposing the photoresist film. According to the present invention, it is possible to form a minute photoresist pattern, thereby. miniaturizing the recess. In addition, it is possible to reduce the fabrication process, since the stopper layers are used as the antireflective film.

In the above-described method, the cover film may be composed of an insulating film. According to the present invention, the insulating film is easily polished but with poor planarization properties. Accordingly, it is possible to obtain the insulating film having excellent planarization properties by applying the present invention.

The above-described method may further include: forming metal layers above the semiconductor substrate. Forming the stop layers may include forming the stop layers on the metal layers; and forming the cover film may include forming the cover film between the metal layers and on the stop layers. According to the present invention, it is possible to improve the planarization of the surface of the embedded layer, also in a case where the embedded layer is formed between the metal layers.

In the above-described method, forming the metal layers includes etching a metal film to become the metal layers by using a mask used for etching the stop layers. According to the present invention, it is possible to reduce the fabrication process by using an identical mask for etching the stopper layers and for etching the metal layers.

According to a second aspect of the present invention, there is preferably provided a method of fabricating a semiconductor device including: forming a first interlayer insulating film above a semiconductor substrate; forming a first layer that includes wiring layers partially above the first interlayer insulating film; forming a cover film between and on the first layers, so that a top surface of the cover film above a region between stop layers is higher than top surfaces of the first layers; forming an embedded layer between the first layers, by polishing the cover film to the first layers; and forming a second interlayer insulating film on the first layers.

In the above-described method, forming the first layers may include forming the wiring layers and forming the stop layers that include silicon oxy-nitride films; and polishing the cover film may include polishing the cover film to the stop layers by using ceria slurry. This makes it possible to further planarize the surface of the second interlayer insulating film, thereby further miniaturizing the wiring on an upper layer.

In the above-described method, forming the stop layers may include etching a layer to become the stop layers; and forming the wiring layers may include etching a metal film to become the wiring layers by using a mask used for etching the stop layers. According to the present invention, it is possible to shorten the fabrication process by using an identical mask for etching the stopper layers and for etching the wiring layer.

According to a third aspect of the present invention, there is preferably provided a semiconductor device including: metal layers provided above a semiconductor substrate; silicon oxynitride films provided on the metal layers; and an embedded layer provided between the metal layers to have a top surface substantially coplanar with top surfaces of the silicon oxynitride films.

According to a fourth aspect of the present invention, there is preferably provided a semiconductor device including: a first interlayer insulating film provided above a semiconductor substrate; first layers provided partially on the first interlayer insulating film, the first layers including wiring layers; an embedded layer provided on the first interlayer insulating film between the first layers to have a top surface substantially coplanar with top surfaces of the first layers; and a second interlayer insulating film formed on the first layers and on the buried layer.

In the above-described semiconductor device, the first layers may include stop layers that include silicon oxy-nitride films formed on the wiring layers. According to the present invention, it is possible to further planarize the surface of second interlayer insulating film, thereby further miniaturizing the wiring on an upper layer.

Fourth Embodiment

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 12:
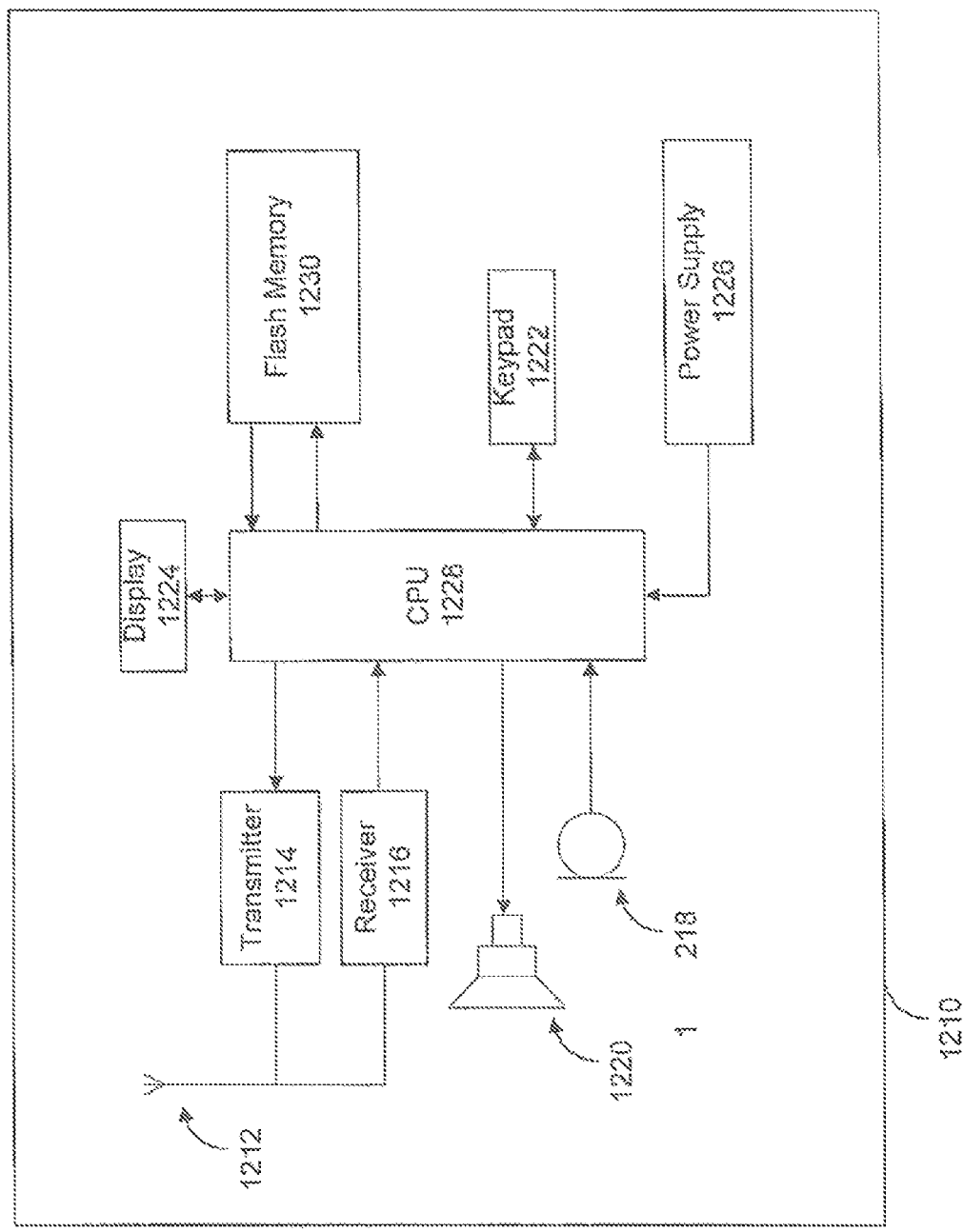
FIG. 12 illustrates a block diagram of a conventional portable phone, upon which embodiments can be implemented.

FIG. 12 shows a block diagram of a conventional portable telephone 1210 (a.k.a. cell phone, cellular phone, mobile phone, internet protocol phone, wireless phone, etc.), upon which embodiments can be implemented. The cell phone 1210 includes an antenna 1212 coupled to a transmitter 1214 a receiver 1216, as well as, a microphone 1218, speaker 1220, keypad 1222, and display 1224. The cell phone 1210 also includes a power supply 1226 and a central processing unit (CPU) 1228, which may be an embedded controller, conventional microprocessor, or the like. In addition, the cell phone 1210 includes integrated, flash memory 1230. Flash memory 1230 includes metal layers provided above a semiconductor substrate; silicon oxy-nitride films provided on the metal layers; and an embedded layer provided between the metal layers to have a top surface substantially coplanar with top surfaces of the silicon oxy-nitride films. Thus, embodiments allow wiring on an upper layer to be miniaturized. Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Fifth Embodiment

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 13:
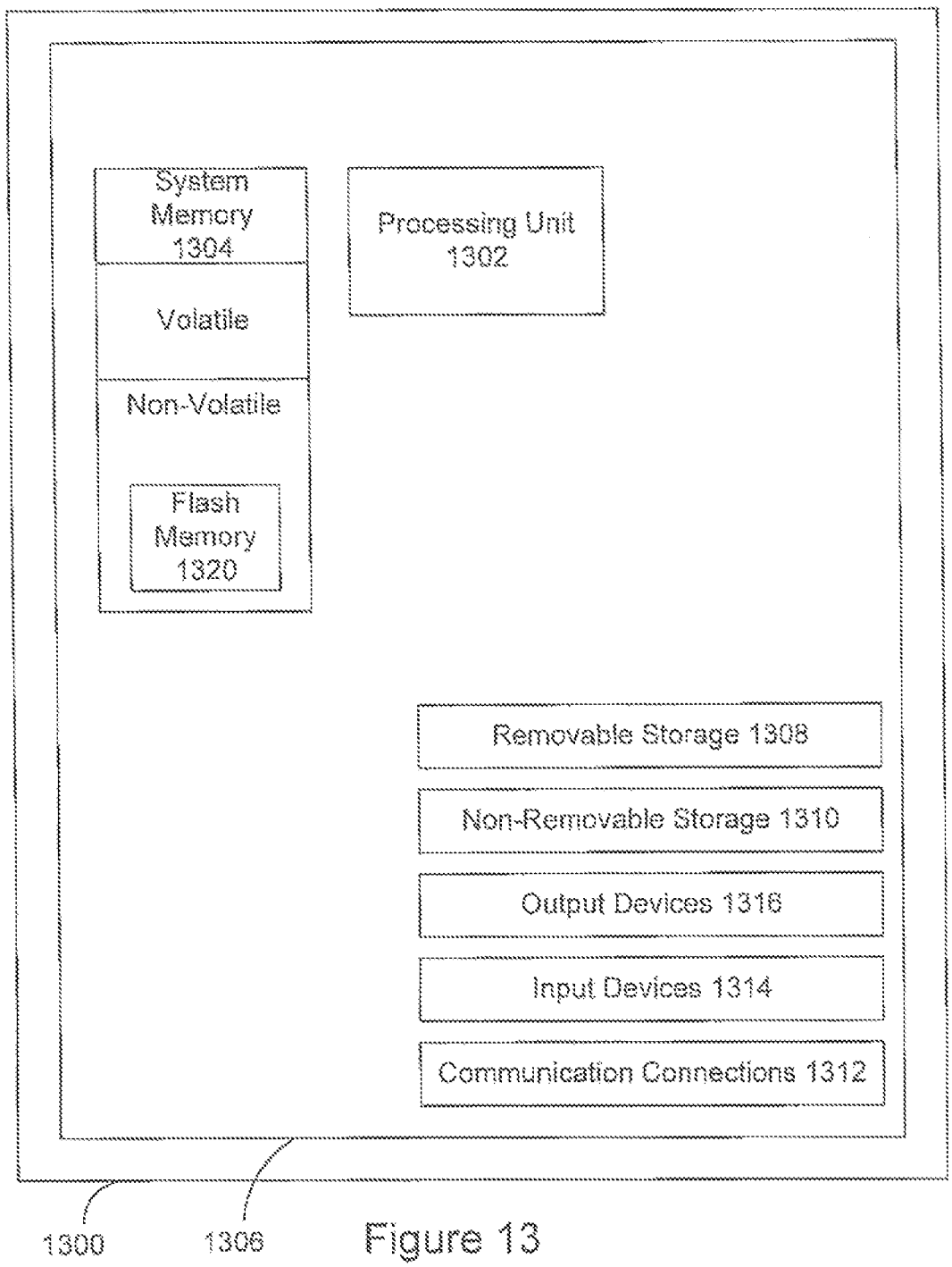
FIG. 13 illustrates a block diagram of a computing device upon which embodiments of the present claimed subject matter can be implemented.

FIG. 13 illustrates a block diagram of a computing device 1300, upon which embodiments of the present claimed subject matter can be implemented. Although computing device 1300 is shown and described in FIG. 13 as having certain numbers and types of elements, the embodiments are not necessarily limited to the exemplary implementation. That is, computing device 1300 can include elements other than those shown, and can include more than one of the elements that are shown. For example, computing device 1300 can include a greater number of processing units than the one (processing unit 1302) shown. Similarly, in another example, computing device 1300 can include additional components not shown in FIG. 13.

Also, it is important to note that the computing device 1300 can be a variety of things. For example, computing device 1300 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 1300 typically includes at least one processing unit 1302 and memory 1304. Depending on the exact configuration and type of computing device, memory 1304 may be volatile (such as RAM), non-volatile (such as ROM, flash memory, etc.) or some combination of the two. This most basic configuration of computing device 1300 is illustrated in FIG. 13 by line 1306. Additionally, device 1300 may also have additional features/functionality. For example, device 1300 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 13 by removable storage 1308 and non-removable storage 1310. Computer storage media includes volatile and nonvolatile, removable and non-removable media implemented in any method or technology for storage of information such as computer readable instructions, data structures, program modules or other data. Memory 1304, removable storage 1308 and non-removable storage 1310 are all examples of computer storage media. Computer storage media includes, but is not limited to, RAM, ROM, EEPROM, flash memory 1320 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 1300. Any such computer storage media may be part of device 1300.

In the present embodiment, the flash memory 1320 comprises: metal layers provided above a semiconductor substrate; silicon oxy-nitride films provided on the metal layers; and an embedded layer provided between the metal layers to have a top surface substantially coplanar with top surfaces of the silicon oxy-nitride films. Thus, embodiments allow wiring on an upper layer to be miniaturized. Further, in one embodiment, the flash memory 1320 utilizes mirrorbit technology to allow storing of two physically distinct bits on opposite sides of a memory cell.

Device 1300 may also contain communications connection(s) 1312 that allow the device to communicate with other devices. Communications connection(s) 1312 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 1300 may also have input device(s) 1314 such as keyboard, mouse, pen, voice input device, game input device (e.g., a joy stick, a game control pad, and/or other types of game input device), touch input device, etc. Output device(s) 1316 such as a display (e.g., a computer monitor and/or a projection system), speakers, printer, network peripherals, etc., may also be included. All these devices are well know in the art and need not be discussed at length here.

Sixth Embodiment

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 14:
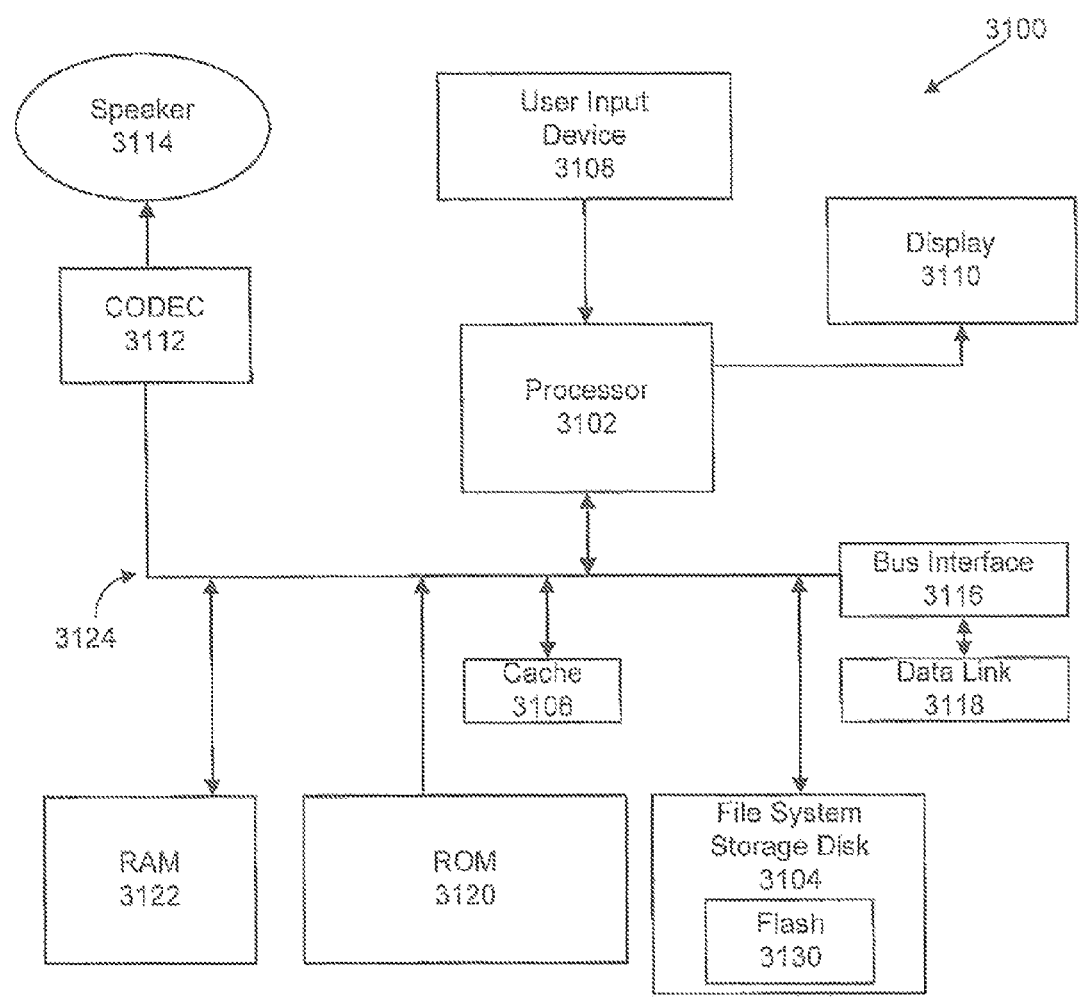
FIG. 14 illustrates an exemplary portable multimedia device, or media player, in accordance with an embodiment of the invention.

FIG. 14 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: metal layers provided above a semiconductor substrate; silicon oxy-nitride films provided on the metal layers; and an embedded layer provided between the metal layers to have a top surface substantially coplanar with top surfaces of the silicon oxy-nitride films. Thus, embodiments allow wiring on an upper layer to be miniaturized. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3112. The CODEC 3112 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

According to the present invention, it is possible to provide a semiconductor device having a film of excellent planarization on a surface thereof and fabrication method therefor.

Although a few preferred embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is applicable to a semiconductor device having the non-volatile semiconductor memory device mounted thereon.

The invention claimed is:

1. A method of fabricating a semiconductor device comprising:
    forming a first metal layer partially above a substrate;
    etching the first metal layer and the substrate using a first mask to form first wiring layers and a trench in the substrate;
    forming a first interlayer insulating film between and on the first wiring layers and planarizing the first interlayer insulating film so that the trench is filled and a top surface of the first interlayer insulating film is above the first wiring layers;
    forming a second metal layer partially above the first interlayer insulating film, and forming silicon oxynitride on the second metal layer;
    etching the silicon oxynitride and the second metal layer using a second mask to form second wiring layers partially above the first interlayer insulating film, and stop layers on the second wiring layers;
    forming a cover film between and on the first layers, so that a top surface of the cover film above a region between stop layers is higher than top surfaces of the stop layers, wherein the first cover film comprises silicon dioxide; and
    forming an embedded layer between the second wiring layers and stop layers, by polishing the cover film to the stop layers using chemical mechanical polishing (CMP).

2. The method of claim 1, wherein polishing the cover film using CMP comprises a polishing pressure of 4.0 pounds per square inch (PSI), and a rotation of the semiconductor substrate of from 40 to 200 revolutions per minute (RPM).

3. A semiconductor device comprising:
    a first interlayer insulating film provided above a semiconductor substrate and covering a first wiring layer formed on the surface of the semiconductor substrate and filling a trench in the substrate, wherein the first interlayer insulating film comprises a planar surface through which top surfaces of the first wiring layer are not exposed;
    a second wiring layer formed on the first interlayer insulating film and stop layers formed on the second wiring layer, wherein the stop layers comprise silicon oxynitride;
    an embedded layer formed on the first interlayer insulating film between the second wiring layer and stop layers and planarized to have a top surface substantially coplanar with top surfaces of the stop layers; and
    a second interlayer insulating film formed on the stop layers and on the embedded layer.

4. A wireless communications device, said wireless communications device comprising:
    a flash memory comprising:
        a first interlayer insulating film provided above a semiconductor substrate and covering a first wiring layer formed on the surface of the semiconductor substrate and filling a trench in the substrate, wherein the first interlayer insulating film comprises a planar surface through which top surfaces of the first wiring layer are not exposed;
        a second wiring layer formed on the first interlayer insulating film and stop layers formed on the second wiring layer, wherein the stop layers comprise silicon oxynitride;
        an embedded layer formed on the first interlayer insulating film between the second wiring layer and stop layers and planarized to have a top surface substantially coplanar with top surfaces of the stop layers; and
        a second interlayer insulating film formed on the stop layers and on the embedded layer;
    a processor;
    a communications component:
    a transmitter;
    a receiver; and
    an antenna connected to the transmitter and the receiver.

5. The wireless communications device of claim 4, wherein said flash memory is NAND flash memory.

6. The wireless communications device of claim 4, wherein said flash memory is NOR flash memory.

7. The wireless communications device of claim 4, wherein said flash memory utilizes mirror-bits technology.

8. A computing device comprising;
a processor;
an input component;
an output component;
a memory comprising:
a volatile memory; and
a flash memory comprising:
   a first interlayer insulating film provided above a semiconductor substrate and covering a first wiring layer formed on the surface of the semiconductor substrate and filling a trench in the substrate, wherein the first interlayer insulating film comprises a planar surface through which top surfaces of the first wiring layer are not exposed;
   a second wiring layer formed on the first interlayer insulating film and stop layers formed on the second wiring layer, wherein the stop layers comprise silicon oxynitride;
   an embedded layer formed on the first interlayer insulating film between the second wiring layer and stop layers and planarized to have a top surface substantially coplanar with top surfaces of the stop layers; and
   a second interlayer insulating film formed on the stop layers and on the embedded layer.

9. The computing device of claim 8, wherein said computing device is a personal computer (PC).

10. The computing device of claim 8, wherein said computing device is a personal digital assistant (PDA).

11. The computing device of claim 8, wherein said computing device is a gaming system.

12. A portable media player comprising:
a processor;
a cache;
a user input component;
a coder-decoder component; and
a memory comprising:
a flash memory comprising:
   a first interlayer insulating film provided above a semiconductor substrate and covering a first wiring layer formed on the surface of the semiconductor substrate and filling a trench in the substrate, wherein the first interlayer insulating film comprises a planar surface through which top surfaces of the first wiring layer are not exposed;
   a second wiring layer formed on the first interlayer insulating film and stop layers formed on the second wiring layer, wherein the stop layers comprise silicon oxynitride;
   an embedded layer formed on the first interlayer insulating film between the second wiring layer and stop layers and planarized to have a top surface substantially coplanar with top surfaces of the stop layers, and
   a second interlayer insulating film formed on the stop layers and on the embedded layer.

13. The portable media player of claim 12, wherein said portable media player is a portable music player.

14. The portable media player of claim 12, wherein said portable media player is a portable video player.

* * * * *